United States Patent
Mc Pherson et al.

(10) Patent No.: US 6,801,042 B2
(45) Date of Patent: Oct. 5, 2004

(54) CALIBRATION METHOD AND APPARATUS FOR SIGNAL ANALYSIS DEVICE

(75) Inventors: Mark E. Mc Pherson, Beaveton, OR (US); Gary J. Waldo, Hillsboro, OR (US); Louis R. Eagle, Portland, OR (US); Leif X. Running, Portland, OR (US); Gary M. Johnson, Hillsboro, OR (US); Frederick A. Azinger, Portland, OR (US); Lynne A. Fitzsimmons, Portland, OR (US); Steve K. Sullivan, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/024,897

(22) Filed: Dec. 18, 2001

(65) Prior Publication Data

US 2003/0112017 A1 Jun. 19, 2003

(51) Int. Cl.[7] .......................... G01R 35/00; G01D 18/00

(52) U.S. Cl. ........................................ 324/601; 702/85
(58) Field of Search ........................ 324/601, 74, 532; 702/85, 89, 107, 108

(56) References Cited

U.S. PATENT DOCUMENTS

| | | | | |
|---|---|---|---|---|
| 4,608,657 A | | 8/1986 | Manome et al. ............. 364/571 |
| 5,180,973 A | * | 1/1993 | Hoogendijk ................. 324/130 |
| 6,064,312 A | * | 5/2000 | Weller ......................... 340/653 |
| 6,463,392 B1 | * | 10/2002 | Nygaard et al. .............. 702/89 |

* cited by examiner

*Primary Examiner*—N. Le
*Assistant Examiner*—Donald M Lair
(74) *Attorney, Agent, or Firm*—Moser, Patterson, Sheridan LLP; William K. Bucher; Francis I. Gray

(57) ABSTRACT

A method and apparatus for calibrating at least signal probes associated with a signal analysis device by storing existing input channel parameters, performing appropriate calibration procedures and restoring input channel operational parameters.

23 Claims, 5 Drawing Sheets

CALIBRATION METHOD AND APPARATUS FOR SIGNAL ANALYSIS DEVICE

FIELD OF THE INVENTION

The invention relates generally to signal analysis devices and, more specifically, to a method and apparatus for calibrating signal analysis devices and associated signal probes.

BACKGROUND OF THE INVENTION

Oscilloscopes, frequency counters, digital multimeters, logic analyzers and the like typically receive input signals in various frequency bands through voltage attenuation probes or optical input probes. Users of such apparatus need to have confidence in the measurements they are making and that probes used to facilitate such measurements are working correctly.

Oscilloscopes, for example, typically provide a probe calibration output terminal that supplies a calibration signal. According to one common calibration method, a square wave signal from a calibration generator is applied to the probe, and the output signal waveform from the probe is observed with an oscilloscope. When the output signal waveform is a correct square-wave, the probe is determined to be calibrated. When the output signal waveform from the probe is not a correct square-wave, the probe calibration is adjusted while observing the waveform with the oscilloscope.

Unfortunately, typical probe calibration schemes suffer from several deficiencies, including: (1) an expectation that users are experts, as evidenced by a lack of user messages or user prompts explaining to users how to perform a calibration or what to look for during the calibration procedure; (2) the loss of previous instrument settings due to adjustments made to acquire and observe a probe calibration signal, thereby making it difficult for the user to return to a previous task; and (3) the lack of automatic adjustment of amplitude readouts in response to a determination of the attenuation factor of a particular probe.

SUMMARY OF INVENTION

These and other deficiencies of the prior art are addressed by the present invention of a method and apparatus for calibrating at least one signal probe associated with a test or measurement device. The invention advantageously allows rapid and accurate calibration, as well as the automatic return to a pre-calibration operating mode of the test or measurement device.

The subject invention is adapted, in one embodiment, to an oscilloscope such that a signal applied to a probe results in the storage of the operational parameters of the input channel in communication with the probe, the analysis of the calibration signal provided by the probe to the input channel, the adaptation of the calibration or operational parameters of the probe and, optionally, in response to this analysis, the restoration of the calibration or operational parameters, as modified. Calibration or operational parameters of the input channel supporting the probe may also be adapted.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The subject invention will be primarily described within the context of an oscilloscope having a "probe check" feature. However, it will be appreciated by those skilled in the art that the invention may be advantageously employed in any signal analysis device in which signal input or translation devices (i.e., voltage attenuation or optical input probes) having adjustable compensation or calibration settings are employed. For example, the teachings of the present invention are applicable to a wide range of signal analysis devices such as oscilloscopes, frequency counters, digital multimeters, logic analyzers and other test and/or measurement devices which receive one or more optical or electrical input signals to be analyzed or otherwise processed.

Figure 1:
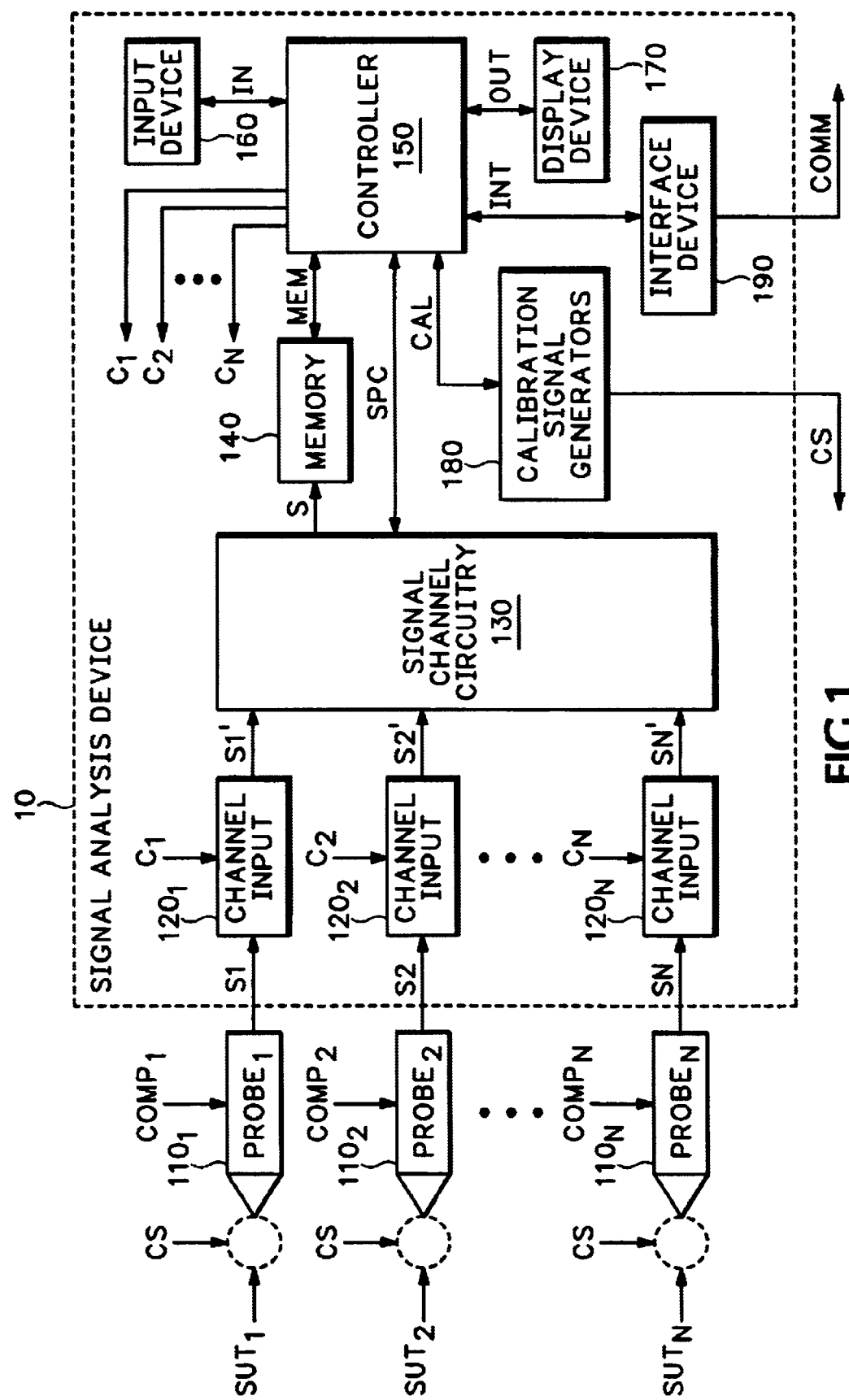
FIG. 1 depicts a high level block diagram of a signal analysis system operatively coupled to a plurality of probes.

FIG. 1 depicts a high level block diagram of a signal analysis device 10 that is capable of receiving respective input signals from a plurality of signal input devices or probes. The signal analysis device 10 of FIG. 1 may simultaneously receive input signals from a single probe or a plurality of probes.

Specifically, the signal analysis device 10 of FIG. 1 comprises a plurality of input channels $120_1$ through $120_N$ (collectively input channels 120), signal processing circuitry 130, a memory 140, a controller 150, an input device 160, a display device 170, a calibration signal generator 180 and an interface device 190.

Each of the input channels $120_1$ through $120_N$ receives a respective input signal $S_1$ through $S_N$ from a corresponding probe $110_1$ through $110_N$. Each of the probes 110 may be connected to a respective signal under test (SUT), a calibration signal CS (e.g., at an individual or common calibration terminal) or may be left unconnected. The calibration signal CS will be discussed in more detail below.

Each of the probes 110 has associated with it a compensation means, such as circuitry capable of modifying the impedance of the probe or adapting the impedance of the probe to the input impedance of a corresponding input channel or signal analysis device. The impedance adjusting means may comprise, for example, a variable capacitor, a varactor, a tuned circuit and the like. Each of the probes 110 typically has associated with it an attenuator factor.

The input channels $120_1$ through $120_N$ couple the respective input signals $S_1$ through $S_N$ to the signal processing circuitry 130 as signals $S_1'$ through $S_N'$. Each of the input channels $120_1$ through $120_N$ optionally receives a respective calibration signal $C_1$ through $C_N$ (collectively calibration signals C). The input channel calibration signals C may be used to alter various calibration or operational parameters of input channel operation, such as time-based delay, signal attenuation, impedance compensation and the like.

Signal processing circuitry 130 includes standard signal processing components (not shown) such as signal buffering circuitry, analog-to-digital conversion (ADC) circuitry, signal conditioning circuitry and the like. The signal processing circuitry 130 operates in a known manner to sample each of the output signals $S_1'$ through $S_N'$ provided by the input channels 120 to provide an output signal S comprising, illustratively, the digitized (and/or processed) input signal(s) multiplexed together. The output signal S provided by signal processing circuitry 130 comprises a digital data stream having a very high data rate (relative to the input channel sample rates) and including data samples from each of the signals $S_1'$ through $S_N'$ provided by the input channels 120. Optionally, the signal processing circuitry 130, in response to a control signal SPC provided by the controller 150, operates to sample only the signals provided by one or more selected input channels 120, to sample the input signals at a higher or lower sample rate, to sample the input signals at a wider or narrower word size (e.g., 4 bits, 6 bits, 8 bits, 16 bits and the like) or to perform other signal processing functions known to those skilled in the art. It is noted that sample rate and word size may be adapted by adapting the operation of, for example, ADC circuitry within the signal processing circuitry 130. Other modifications to signal processing circuitry (such as over-sampling or under-sampling, alias processing and the like) will be readily appreciated by those skilled in the art informed by the teachings of the present invention.

The memory 140 operates to store, in a high speed first in first out (FIFO) manner, the data stream S provided by the signal processing circuitry 130. The memory 140 cooperates with the controller 150 to store data samples in a controlled manner such that samples from a desired input channel or channel (or channels), a desired time period (or periods), samples having amplitude excursions above or below desired threshold levels and the like, may be provided to the controller 150 for further processing and/or analysis.

The controller 150 is used to manage the various operations of the signal analysis device 10. The controller 150 performs various processing and analysis operations on the data sample stored within the memory 140. The controller 150 receives user commands via an input device 160, illustratively a keypad or pointing device. The controller 150 provides image-related data to a display device 170, illustratively a cathode ray tube (CRT), liquid crystal display (LCD) or other display device. The controller 150 optionally communicates with a communications link COMM, such as a general purpose interface bus (GPIB), Internet protocol (IP), Ethernet or other communications link via the interface device 190. It is noted that the interface device 190 is selected according to the particular communications network used. An embodiment of the controller 150 will be described in more detail below with respect to FIG. 2.

The controller 150 controls the calibration signal generator 180 via a control signal CAL. The calibration signal generator 180 includes known signal generating circuitry, such as frequency sources, pulse sources, as well as means for modifying the output frequency, duty cycle, amplitude and other parameters of the calibration signal CS produced by the calibration signal generator 180. It is noted that the generated calibration signal generator CS is preferably coupled to one or more calibration points proximate input terminals associated with the various input channels 120. In this manner, the probes 110 may be easily connected to the calibration terminals to effect the methods of the present invention.

In one mode of operation, the calibration signal generator 180 provides a square wave signal having a known duty cycle and an amplitude. When this signal is received by a probe 110, the compensation COMP associated with the probe may be adjusted such that the displayed signal imagery conforms to an appropriate wave shape. When the output signal waveform, i.e., the displayed waveform, substantially approximates the wave shape of the calibration signal CS, the probe 110 is deemed to be calibrated.

In one mode of operation, the calibration signal CS produced by the calibration signal generator 180 is modified in a known manner, such as a square wave having imparted to it a "sweep" through various frequencies over a known time period, modifications to duty cycle, modifications to amplitude and the like. In this manner, subsequent analysis by the controller 150 of the corresponding signal samples enables the controller to determine whether a particular probe 110 is, in fact, coupled to the calibration signal CS. Thus, a probe coupled to a signal under test (SUT) having characteristics similar to those of the calibration signal CS will likely not be deemed by the controller 150 to be coupled to the calibration signal CS.

Figure 2:
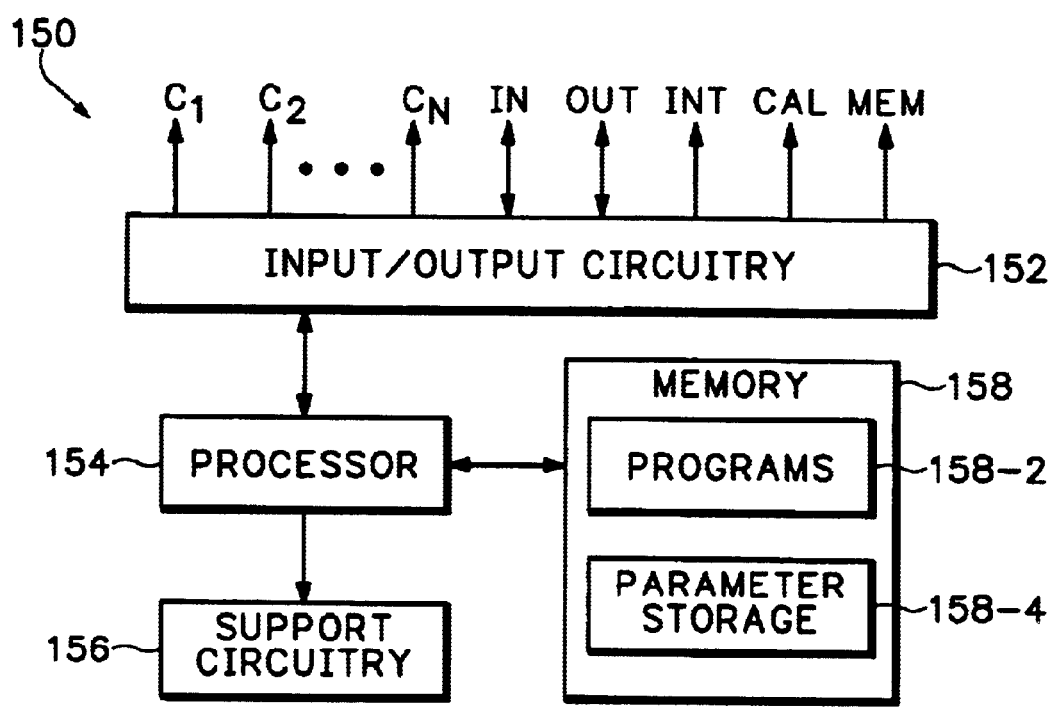
FIG. 2 depicts a high level block diagram of a controller suitable for use in the signal analysis system of FIG. 1.

FIG. 2 depicts a high level block diagram of a controller suitable for use in the signal analysis device 10 of FIG. 1. Specifically, the controller 150 of FIG. 2 comprises a processor 154 as well as memory 158 for storing various control programs 158-2. The processor 154 cooperates with conventional support circuitry 156 such as power supplies, clock circuits, cache memory and the like as well as circuits that assist in executing the software routine stored in the memory 158. As such, it is contemplated that some of the process steps discussed herein as software processes may be implemented within hardware, for example as circuitry that cooperates with the processor 154 to perform various steps. The controller 150 also contains input/output (I/O) circuitry 152 that forms an interface between the various functional elements communicating with the controller 150. For example, in the embodiment of FIG. 1, the controller 150 communicates with each of the plurality of input channels 120 via respective signal paths C, the input device 160 via a signal path IN, the display device 170 via a signal path OUT, the interface device 190 via a signal path INT, the calibration signal generator 180 via a signal path CAL and the memory 140 via a signal path MEM. It is noted that in one embodiment of the signal analysis device 10 of FIG. 1, the memory 140 may be included within the memory 158 associated with the controller 150.

Although the controller 150 of FIG. 2 is depicted as a general purpose computer that is programmed to perform various control functions in accordance with the present invention, the invention can be implemented in hardware as, for example, an application specific integrated circuit (ASIC). As such, the process steps described herein are intended to be broadly interpreted as being equivalently performed by software, hardware, or a combination therof.

Figure 3A:
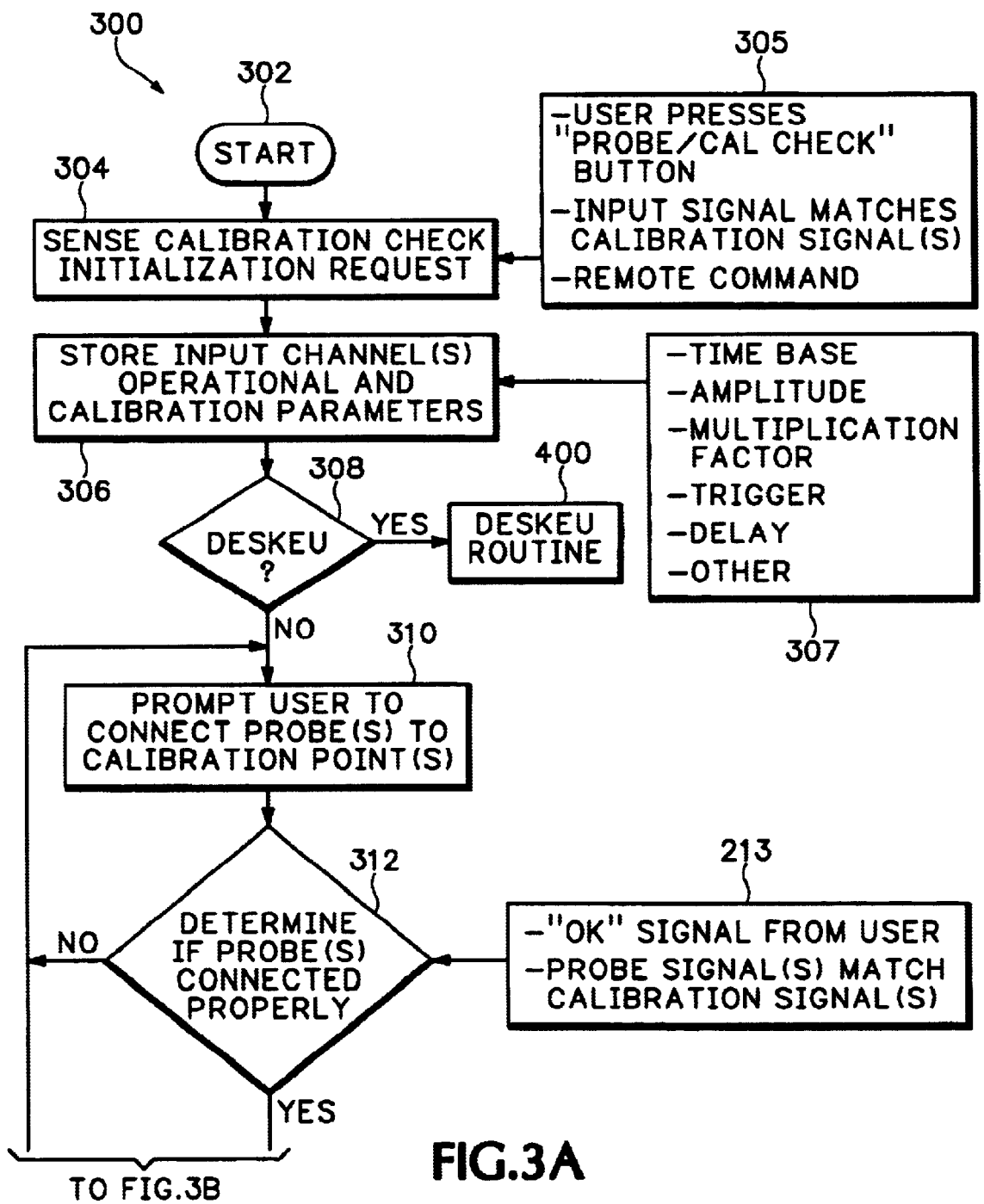
FIG. 3 depicts a flow diagram of a calibration method.
Figure 3B:
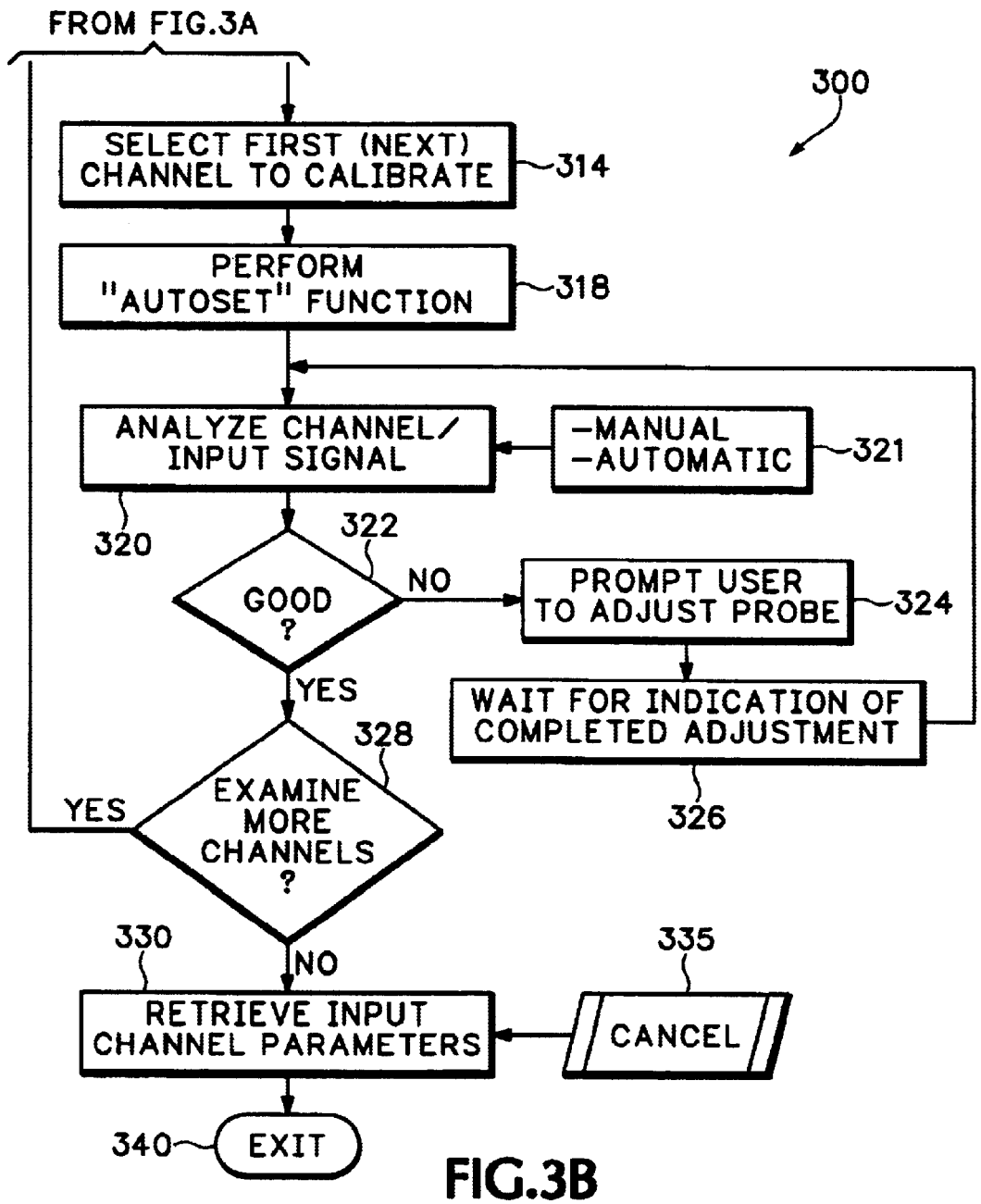

FIG. 3 depicts a flow diagram of a calibration method 300 suitable for use in the signal analysis device 10 of FIG. 1. The method 300 is entered at step 302 and proceeds to step 304, where a calibration check initialization request is sensed by, for example, the controller 150 of the signal analysis device 10 of FIG. 1. As noted in box 305, this request may comprise a user pressing a "probe/cal check" button (or other button) associated with the input device 160, a determination by the controller 150 that one or more input signals ($S_1$ through $S_N$) match the calibration signal CS, or the receipt of a remote command via the interface device 190. As previously discussed, the calibration signal CS may comprise a known signal that is modified in a known manner such that the controller 150 may determine that a calibration signal, rather than a signal under test, is provided by the probe. The controller 150 is capable of sensing such modifications and determining thereby that the appropriate calibration signal is being provided via a probe.

At step 306, the operational and calibration parameters associated with one or more of the input channels 120 are stored in, illustratively, a parameter storage portion 158-4 of memory 158. As noted in box 307, such parameters may comprise the time base, amplitude, multiplication factor, trigger setting, delay setting and other parameters associated with an input channel of a signal analysis device.

Operational parameters comprise the operational (typically user selectable) parameters that determine the operating characteristics of an input channel. Adjustments to these parameters cause an input signal received by the input channel to be processed in a certain manner. For example, common operational parameters of an input channel of an oscilloscope comprise the time base, vertical scale, trigger level (and trigger criteria), as well as other common parameters typically selected by a user to enable the appropriate representation of the received input signal on a display device.

Calibration parameters comprise those parameters used to adapt, offset or otherwise modify operational parameters such that the operation of an input channel can be normalized or calibrated. Signal amplitude operational parameters may also be modified by signal amplitude calibration parameters, such that common input signals are attenuated, amplified or temporally synchronized to the same degree by each of the plurality of input channels. Other calibration parameters include impedance matching parameters and the like.

At step 308, a query is made as to whether a deskew operation is desired. If a deskew operation is desired, then at step 400 the deskew operation is performed. If a deskew operation is not desired (e.g., only a probe or input channel calibration operation is desired), then at step 310 the user is prompted (i.e., a message is displayed) to connect probe(s) to the calibration point(s). In one embodiment, if more than one probe is connected to a calibration terminal (or respective calibration terminals), then it is presumed that the user desires a deskew operation. The user may also indicate such desire by interacting with user prompts or messages provided via the display device.

A "deskew" operation is one that temporally synchronizes the operation of each of a plurality of input channels such that a leading (or trailing) edge of a calibration signal applied to each input channel results in an output signal (e.g., a displayed waveform) comprising substantially identical waveforms for each of the input channels. Thus, in a deskew operation, the time base operational parameter of one or more channels is modified by a respective time base calibration parameter that serves to advance or retard the time base operational parameter. The deskew is optionally performed on each of a plurality of time bases (i.e., horizontal scale settings on an oscilloscope).

At step 312, a determination is made as to whether the probe(s) connected at step 310 were connected properly. As noted in box 313, this determination may be made manually by receiving an "O.K. proceed" signal from the user (e.g., via the input device 160). The determination may be made automatically by matching the input signal(s) provided by the probe(s) to calibration signal(s) provided at the calibration point(s). If the probe(s) are not connected properly, then steps 310–312 are repeated. Otherwise, the method 300 proceeds to step 314. Several manual and automatic methods for determining proper probe connection are suitable for use within the context of the present invention.

In one embodiment of the invention, the calibration signal provided by one or more probes is displayed on a display device such that a user may determine whether the signal is of appropriate shape. Such determination may be made with reference to a display region associated with the display device that delineates a display envelope within which a calibration signal provided by a correctly calibrated probe is displayed. That is, given an expected wave shape of a calibration signal provided by a properly calibrated probe, and assuming appropriate triggering, the display device delineates a region by, for example, color, shading, dotted lines or other delineation means, wherein an appropriate calibration signal should be displayed. This greatly assists a user in visually determining whether a probe or input channel is properly calibrated. Moreover, in a related embodiment, where an initial calibration signal (e.g., calibration signal CS) is modified such that the output signal of one or more input channels may be verified as being in communication with the initial calibration signal, such modifications may result in modifications to the displayed envelope or delineated region on the display device. Thus, where a calibration signal is modified by increasing the frequency, the delineated display region is correspondingly modified to appropriately define the region associated with the newly modified calibration signal.

In one embodiment of the invention, an automatic determination of the attenuation factor associated with a probe is made. The attenuation factor associated with a probe may be communicated to the signal analysis device 10 using several techniques, some of which are discussed below in more detail. Since probe attenuation is typically a user selectable parameter of a probe, it may be necessary to periodically determine, for each probe, the current selected probe attenuation factor. In one adaptation of this embodiment, the probe attenuation factor is automatically corrected by the controller 150.

In one embodiment of the invention, an automatic determination of the source of a probe's input signal is made by varying calibration signal(s) in a known manner, monitoring the signal provided by the various input channels, and determining whether variations in the provided signal substantially conform to the variations made to the calibration signal. For example, a calibration signal comprising a square wave may be modified in frequency, amplitude and/or duty cycle such that even if the voltage attenuation probe and/or the input channel to which it provides a signal is out of calibration, variations in the "uncalibrated" signal provided by the input channel and processed by the controller 150 are recognizable as such. Thus, this embodiment of the invention advantageously avoids the condition of "false" determination of the presence of the calibration signal, such as may occur where a signal under test coincidentally happens to possess characteristics similar to an expected calibration signal. It is important to note that each instance described within the present specification of determining whether a calibration signal exists may be performed using the above technique of calibration signal variation. Thus, the inventors contemplate that all embodiments of the present invention may include calibration signal variations performed in a manner tending to identify whether or not a calibration signal is actually provided via a particular input channel.

At step 314, the first or next channel to be calibrated is selected. At step 318, an "auto set" function is performed on the channel selected at step 314. The auto set function automatically sets various operational parameters of the input channel such that the signal received by the input channel may be analyzed by the controller 150 and/or appropriately displayed. For example, in the case of signal analysis device 10 comprising an oscilloscope, input channel operational parameters adjusted by the auto set function comprise, illustratively, time base, vertical scale (i.e., volts per division) and other operational parameters. In the case of other types of signal analysis devices, different types of operational parameters may be adjusted (e.g., frequency per division).

At step 320, the input signal received by the selected channel is analyzed. As noted in box 321, such analysis may comprise manual or automatic analysis. In the case of manual analysis, the calibration signal communicated to the probe is processed to produce a wave shape or other signal-representative image on the display device 170. The user views the displayed wave shape and determines whether or not adjustment of probe compensation would improve the wave shape (i.e., produce an appropriate wave shape). In the case of automatic analysis, the calibration signal communicated to the probe is digitized and then processed by the controller 150, which employs one or more signal processing functions to the data set representing the received input signal. For example, the controller 150 may determine whether the input signal conforms exactly (or within an error threshold) to a desired wave shape, whether the actual wave shape of the input signal is within a predefined region or envelope (temporal and/or vertical scale), whether the input signal is sufficiently similar to the calibration signal and other processes.

At step 322, a query is made as to whether the analysis of step 320 results in a "good" or a "calibrated" determination with respect to the probe associated with the selected input channel. If the query at step 322 is answered negatively, then at step 324 the user is prompted to adjust the compensation of the corresponding probe. At step 326, the method waits for indication of a completed adjustment of probe compensation. Such indication may comprise, for example, the user pressing a "continue" button on an input device 160, or a determination by a controller 150 that such adjustment has been completed. In the case of automatic determination of such indication, the controller 150 performs automatic analysis similar to that performed at step 320, prompting the user to cease adjustment of probe compensation at such time as probe compensation is correct. After completion of manual probe adjustment, the method returns to step 320.

When the query at step 322 indicates that probe compensation is correct, a query at step 328 is made as to whether more channels are to be examined. If more channels are to be examined, then steps 310 through 328 are repeated for the next channel. If no more channels are to be examined, then at step 330 the input channel and calibration parameters stored at step 306 are retrieved, and the operation of the various input channels 120 are returned to their former operational state. To the extent that the calibration of an input channel has been effected, the respective retrieved input channel calibration parameters are modified in accordance with that calibration. The method 300 then exits at step 340.

The above-described method 300 of FIG. 3 may be terminated at any time by a user pressing a "cancel" button on, for example, a keypad associated with input device 160. The method 300 is interrupted by a cancel command, as indicated by box 335. After receiving a cancel command, input channel parameters are retrieved as described above with respect to step 330, and the method 300 exits at step 340. In one embodiment, the cancel command comprises a determination by the controller 150 that the signal supplied by one or more probes is no longer a calibration signal. That is, when the controller 150 determines that the signal supplied by a probe no longer conforms to the expected calibration signal (either modified or unmodified), the controller determines that the user has aborted the calibration procedure and the calibration procedure is exited after retrieving prior input channel operational and calibration parameters. This cancellation process may be enabled for each probe individually, all of the probes, or a subset of the probes.

The above-described calibration method may be modified by those skilled in the art and informed by the teachings of the present disclosure. For example, the inventors contemplate that a calibration operation may be initiated by the controller 150 simply determining that a probe has been connected to a calibration jack. This determination may be made in a number of ways. For example, each input channel may include circuitry (not shown) that looks for the presence of a specific calibration signal. The controller may periodically examine each input channel and, upon detecting the presence of the calibration signal, initiate the calibration method. In another embodiment, the calibration jack itself determines that a probe has been connected. This may be performed by detecting changes in capacitance between the calibration jack and a ground point indicative of the connection of a probe between the calibration jack and ground. The calibration jack may also detect specific electrical or mechanical characteristics of the probe, such as the presence or absence of auxiliary probe contacts which enable the completion of a circuit upon the connection of a probe. Additionally, a proximity circuit or optical sensor may be employed to detect the presence of a probe near a calibration jack.

In one embodiment, the deskew query at step 308 is answered affirmatively by the presence of calibration input signals received from a plurality of input channels. This embodiment may be modified to perform a probe calibration for each of the probes supplying a calibration signal, as well as performing a deskew operation for the plurality of input channels. Additionally, it is noted that the display device 170 of the signal analysis device 10 may be used in conjunction with the input device 160 to interact with a user such that calibration initiation and calibration termination commands, as well as various status messages and user prompts or messages, may be provided. Various user interaction models presently available to those skilled in the art may be used for this purpose.

Figure 4:
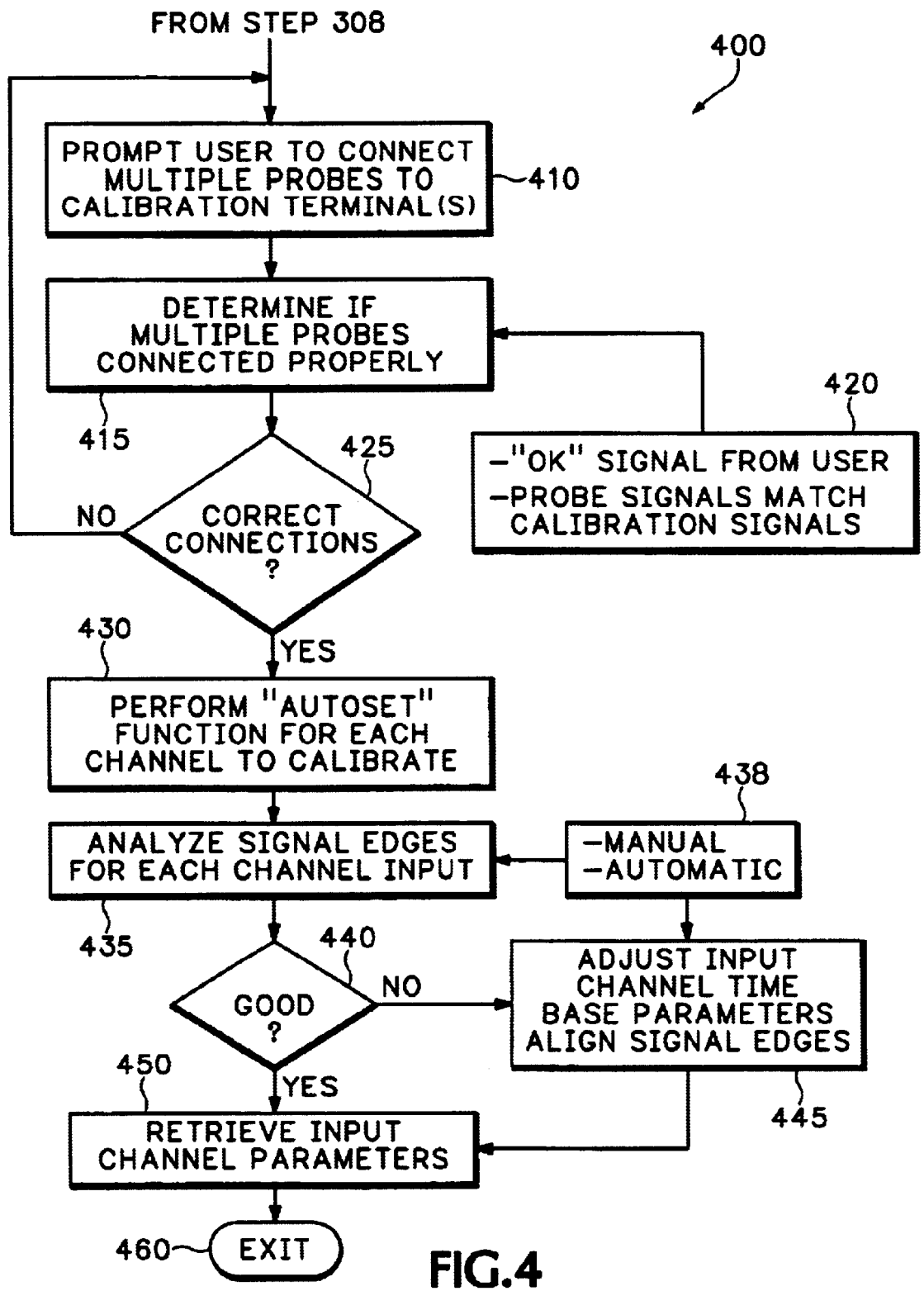
FIG. 4 depicts a high level block diagram of a deskew method.

FIG. 4 depicts a high-level block diagram of a deskew routine 400 suitable for use in the method 300 of FIG. 3. The method 400 of FIG. 4 is entered at step 410, where the user is prompted to connect multiple probes to the calibration terminal(s).

At step 415, a determination is made as to whether multiple probes have been connected properly. As noted in box 420, such determination may be made manually by receiving an "O.K." signal from the user, or automatically by matching the received signal from the various input channels to the calibration signals CS produced by the calibration signal generator 180. If it is determined that the probes are connected properly, then at step 430 an "auto set" function is performed for each channel to be calibrated. The auto set function is as described above with respect to step 318.

At step 435, an analysis is made of the signal edges for each signal received by the input channels. As noted in box 438, such analysis may be performed using manual or automatic means. In a manual mode of operation, each of the received signals is displayed on the display device 170. In this manner, a user may visually ascertain, for example, whether leading or trailing edges of a series of pulses are temporally aligned. In an automatic mode of operation, controller 150 determines whether such leading or trailing edges of signal pulses are temporally aligned. In one embodiment, the controller 150 utilizes existing trigger circuitry or logic to identify gaps in time between corresponding edges of input signals and determine thereby temporal alignment (or misalignment).

At step 440, a determination is made as to whether the temporal synchronization of the various input channels is "good."

If the wave shapes provided by the various input channels exhibit temporal skew, then at step 445 the input channel time base parameters of one or more of the input channels is adjusted to temporally align corresponding signal edges. The adjustment of step 445 may be made manually or automatically. In the manual of operation, a user introduces time base delay (or advance) to one or more of the input channels such that the displayed wave forms exhibit corresponding leading or trailing edges. In an automatic mode of operation, the controller 150 calculates appropriate time base delay (or advance) and automatically modifies the various input channels using the calibration signal C. After adjusting the input channel time base parameters to reduce the temporal skew, the method 400 proceeds to step 450.

If the wave shapes provided by the various input channels do not exhibit temporal skew, then at step 450 the input channel calibration and/or operational parameters previously stored at step 306 are retrieved. Step 450 operates in substantially the same manner as described above with respect to step 330.

The above-described invention advantageously enables a user of a signal analysis device such as an oscilloscope to easily perform a calibration procedure and, importantly, easily return to a prior test or measurement mode. The invention optionally employs the detection of a calibration signal and may perform various calibration functions in an automatic, semi-automatic or manual mode.

In one embodiment, a "probe check" feature is implemented in, illustratively, an oscilloscope. A user connects a probe to a calibrator terminal and depresses a "probe check" button on the oscilloscope. The oscilloscope then displays the calibration signal on a display screen and continues to do so until the probe is removed. After the probe is removed, the oscilloscope returns to the previous settings. The oscilloscope changes the probe attenuation factor of the input channel to match the probe attenuation factor of the probe currently in use. When the oscilloscope detects a valid calibration signal, the message "channel X probe O.K." is displayed. If the oscilloscope does not detect a valid calibration signal, a message is displayed stating that a probe is not connected to the calibration terminal (a broken probe will also cause this condition). If the oscilloscope detects that the probe compensation needs to be adjusted, a message is displayed explaining that adjustment is necessary and describing how such adjustment is made.

In one embodiment, the oscilloscope displays an overshoot or under-shoot value that approaches a predefined number (e.g., zero) as a compensation of the probe is properly adjusted. In this embodiment, the oscilloscope displays either the square waveform or simply displays over-shoot and/or under-shoot value. Thus, the user can adjust the probe and return to previous user settings with a minimum of effort.

Optional conditions detected by a signal analysis device such as an oscilloscope include determining that the signal return terminal of a probe is not at ground, determining that the amplitude of an input signal is incorrect, determining that too much noise exists on the signal to accurately calibrate the probe (i.e., signal noise above a threshold level) and the like. Each of these conditions may be associated with a respective error message. As previously noted, the oscilloscope may determine whether a signal received via a probe matches a calibration signal, which calibration signal may be modified in a predetermined manner.

In one embodiment of the invention, there is no automatic saving and restoring of the pre-probe check state. In this embodiment, the previously discussed methods and apparatus are modified to perform the following functions within the context of, for example, an oscilloscope: (1) Drawing lines or a region on the screen (display) indicating where a properly calibrated/compensated signal should be; (2) automatically making a "go"/"no go" determination and providing a corresponding indication to the user; (3) automatically setting a correct probe attenuation; (4) (optional) automatically saving and restoring the pre-probe check state; and (5) verifying that the probe is actually connected to the probe compensation signal. The above step (4) is optional, and is not used in the "no-saving" embodiment.

While foregoing is directed to the preferred embodiment of the present invention, other and further embodiments of the invention may be devised without departing from the basic scope thereof, and the scope thereof is determined by the claims that follow.

What is claimed is:

1. A method, comprising:
    storing, in response to a calibration initiation, at least one operational parameter of an input channel in communication with a probe;
    applying a signal to said probe;
    verifying automatically from an output signal communicated by said probe in response to the applied signal that the applied signal is a valid calibration signal;
    determining, if the applied signal is verified as the valid calibration signal, whether the output signal exhibits a characteristic indicative of inappropriate probe operation;
    adapting at least one calibration parameter in response to a determination of inappropriate probe operation; and
    retrieving said at least one operational parameter of said input channel.

2. The method of claim 1, wherein said calibration initiation comprises an indicium of a user request to calibrate.

3. The method of claim 1, wherein:
    said step of retrieving said at least one operational parameter of said input channel is performed after a determination that said exhibited characteristic indicative of inappropriate probe operation has been reduced to a threshold level.

4. The method of claim 3, further comprising displaying a user message indicative of a completed calibration.

5. The method of claim 1, wherein said calibration parameter comprises a probe compensation parameter.

6. The method of claim 1, further comprising:
    detecting an attenuation factor associated with said probe.

7. The method of claim 1, wherein said calibration parameter comprises at least one operational parameter of said input channel, said adapted at least one operational parameter tending to offset said characteristic indicative of inappropriate probe operation.

8. The method of claim 1, wherein said output signal is displayed on a display device, said inappropriate probe operation being determined using said displayed output signal.

9. The method of claim 8, wherein a display region associated with said display device delineates a display envelope within which said output signal provided by a correctly calibrated probe is displayed.

10. The method of claim 9, further comprising:

modifying said applied signal; and modifying said display region associated with said display device in a manner consistent with said applied signal modifications.

11. The method of claim 1, wherein said step of determining comprises comparing said output signal to a reference calibration signal, said characteristic indicative of inappropriate probe operation comprising an unfavorable comparison.

12. The method of claim 1, wherein said verifying step comprises:

modifying at least one of a frequency parameter, a duty cycle parameter and an amplitude parameter of said applied signal;

comparing said output signal to a reference calibration signal; and said step of determining being avoided in the case of an unfavorable comparison of said output signal with the reference calibration signal.

13. The method of claim 1, further comprising:

displaying at least one of an over-shoot or under-shoot value associated with said output signal, said over-shoot and under-shoot values approaching a predefined value as a compensation of said probe is properly adjusted.

14. The method of claim 1, wherein said probe communicates with any one of a plurality of input channels, said method further comprising:

for each input channel having associated with it the valid calibration signal, performing the steps of storing, determining, adapting and retrieving.

15. The method of claim 1, wherein in the case of said output signal being communicated by each of a plurality of probes, each of said plurality of probes communicating via a respective input channel; said method is modified as follows:

said step of storing comprises storing at least one operational parameter of each of said plurality of input channels;

said applying step comprises applying said signal to each of said plurality of probes;

said verifying step comprises verifying that said output signal communicated by each of said plurality of probes corresponds to the valid calibration signal;

said step of determining comprises determining whether said output signals exhibit inappropriate temporal synchronization;

said step of adapting comprises adapting a temporal offset parameter of al least one input channel in response to a determination of inappropriate temporal synchronization; and said step of retrieving comprises retrieving said storing said at least one operational parameter of each of said plurality of input channels.

16. The method of claim 15, wherein said calibration initiation comprises at least one of a detection of the valid calibration signal via each of said plurality of input channels and an indicium of a user request to perform a deskew operation.

17. The method of claim 1, further comprising:

determining whether an error condition exists, said error condition comprising at least one of a return terminal of a probe being incorrectly grounded, an amplitude of an input signal being incorrect, and signal noise above a threshold level being present.

18. A method, comprising:

storing, in response to a calibration initiation, at least one operational parameter of each of a plurality of input channels in communication with respective probes;

applying a signal to said respective probes in communication with each of said plurality of input channels;

verifying automatically from respective output signals communicated by said probes in response to the applied signal that the applied signal is a valid calibration signals;

determining, if said output signals are verified as being response to the valid calibration signal, whether said output signals exhibit a characteristic indicative of inappropriate temporal synchronization;

adapting a temporal calibration parameter of at least one of said input channels in response to a determination of inappropriate temporal synchronization; and retrieving said at least one operational parameter of each of a plurality of input channels.

19. A method for use in a signal analysis device, said signal analysis device comprising a plurality of input channels and a processor, each of said input channels capable of receiving an input signal from a respective probe and producing therefrom a respective output signal, said processor adapted to process data representative of at least one of said output signals, said method comprising:

storing, in response to a calibration initiation, at least one operational parameter of an input channel in communication with a probe;

applying a signal to said probe;

verifying automatically from an output signal communicated by said probe that the applied signal is a valid calibration signal;

determining, if said output signal corresponds to the valid calibration signal, whether said output signal exhibits a characteristic indicative of inappropriate probe operation;

adapting at least one calibration parameter in response to a determination of inappropriate probe operation; and retrieving said at least one operational parameter of said input channel.

20. The method of claim 19, wherein said step of retrieving is performed in response to an indicium of a user request to terminate calibration.

21. The method of claim 20, wherein said user indicium comprises at least one of a cancel command and a determination that said applied signal is not the valid calibration signal.

22. A signal analysis device, comprising:

a plurality of input channels, each of said input channels capable of receiving an input signal from a respective probe and producing therefrom a respective output signal;

a processor, adapted to process data representative of at least one of said output signals; and a calibration signal generator, for generating a calibration signal for communication to at least one of said input channels via a respective probe;

said processor, in a calibration mode, storing operational parameters of an input channel having associated with it a probe to be calibrated, verifying from an output signal communicated via said respective probe that the input signal is a calibration signal, enabling the calibration of said probe to be calibrated when the input signal is verified as the calibration signal, and restoring to said input channel the stored operational parameters.

23. The signal analysis device of claim 22, wherein said signal analysis device comprises an oscilloscope.

* * * * *